(12) United States Patent
Mathieu et al.

(10) Patent No.: US 12,131,987 B2
(45) Date of Patent: *Oct. 29, 2024

(54) BIOMETRIC SENSOR MODULE FOR A SMART CARD AND METHOD FOR MANUFACTURING SUCH A MODULE

(71) Applicant: Linxens Holding, Mantes-la-Jolie (FR)

(72) Inventors: Christophe Mathieu, Mantes la Jolie (FR); Carsten Nieland, Gotha (DE)

(73) Assignee: Linxens Holding, Mantes-la-Jolie (FR)

( * ) Notice: Subject to any disclaimer, the term of this patent is extended or adjusted under 35 U.S.C. 154(b) by 121 days.

This patent is subject to a terminal disclaimer.

(21) Appl. No.: 17/603,829

(22) PCT Filed: Apr. 16, 2020

(86) PCT No.: PCT/FR2020/000129
§ 371 (c)(1),
(2) Date: Oct. 14, 2021

(87) PCT Pub. No.: WO2020/212661
PCT Pub. Date: Oct. 22, 2020

(65) Prior Publication Data
US 2022/0216137 A1 Jul. 7, 2022

(30) Foreign Application Priority Data
Apr. 19, 2019 (FR) ...................................... 1904204

(51) Int. Cl.
*G06K 7/08* (2006.01)
*G06K 19/073* (2006.01)
(Continued)

(52) U.S. Cl.
CPC .. *H01L 23/49838* (2013.01); *G06K 19/07354* (2013.01); *H01L 21/4853* (2013.01);
(Continued)

(58) Field of Classification Search
CPC . H01L 21/4853; H01L 29/7869; H01L 27/06; H01L 24/48; H01L 2224/73265;
(Continued)

(56) References Cited

U.S. PATENT DOCUMENTS

| | | |
|---|---|---|
| 2010/0194331 A1* | 8/2010 | Lai ......................... H01L 23/66 361/679.01 |
| 2017/0277936 A1 | 9/2017 | Slottner |
| 2018/0168035 A1* | 6/2018 | Kim ...................... H05K 3/282 |
| 2018/0174018 A1 | 6/2018 | Lundberg et al. .............. 19/145 |

(Continued)

FOREIGN PATENT DOCUMENTS

| | | |
|---|---|---|
| DE | 101 39 414 A1 | 2/2003 |
| EP | 2 009 702 A1 | 12/2008 |

(Continued)

*Primary Examiner* — Daniel St Cyr
(74) *Attorney, Agent, or Firm* — Harrington & Smith

(57) ABSTRACT

Biometric sensor module for a chip card, and method for producing such a module. Method for producing a biometric sensor module for a chip card, including steps of providing a dielectric carrier including a front face and a back face, both forming main faces of the carrier, attaching a biometric sensor for detecting fingerprints to the back face, a detection area covered by the sensor on the back face being placed opposite a detection area on the front face, producing electrically conductive connection pads on the back face of the carrier which are electrically connected to the biometric sensor, at least one connection pad includes a region that is wettable with a solder material, extending over an area of between 0.2 and 5 square millimetres.

15 Claims, 3 Drawing Sheets

(51) Int. Cl.
*H01L 21/48* (2006.01)
*H01L 23/498* (2006.01)
*H01L 23/00* (2006.01)

(52) U.S. Cl.
CPC ..... *H01L 23/49811* (2013.01); *H01L 23/4985* (2013.01); *H01L 24/32* (2013.01); *H01L 24/48* (2013.01); *H01L 24/73* (2013.01); *H01L 24/83* (2013.01); *H01L 2224/32225* (2013.01); *H01L 2224/48225* (2013.01); *H01L 2224/73265* (2013.01); *H01L 2224/8385* (2013.01)

(58) Field of Classification Search
CPC ........ H01L 23/49811; H01L 23/49855; G06K 19/077; G06K 19/07749; G06K 19/07; G06K 19/07354; G06K 19/0723; G06K 19/07747; G06K 19/07743
USPC .......................................... 235/451, 487, 492
See application file for complete search history.

(56) References Cited

U.S. PATENT DOCUMENTS

| | | | |
|---|---|---|---|
| 2020/0034679 | A1 | 1/2020 | Proye et al. |
| 2020/0212185 | A1* | 7/2020 | Yamazaki ............... H01L 29/26 |
| 2020/0243514 | A1* | 7/2020 | Yamazaki ......... H01L 29/78648 |

FOREIGN PATENT DOCUMENTS

| | | |
|---|---|---|
| EP | 3 336 759 A1 | 6/2018 |
| FR | 3 061 333 | 6/2018 |
| FR | 3 063 555 | 9/2018 |
| JP | H-11102926 A | 4/1999 |
| JP | 2000182017 A | 6/2000 |
| JP | 2004304054 A | 10/2004 |
| JP | 2004319678 A | 11/2004 |
| JP | 2011049307 A | 3/2011 |
| JP | 2017107955 A | 6/2017 |
| WO | WO-2011/080262 A | 7/2011 |
| WO | WO-2014/206505 A1 | 12/2014 |
| WO | WO-2016/037694 A1 | 3/2016 |
| WO | WO-2017/168100 A1 | 10/2017 |

* cited by examiner

FIG. 3a
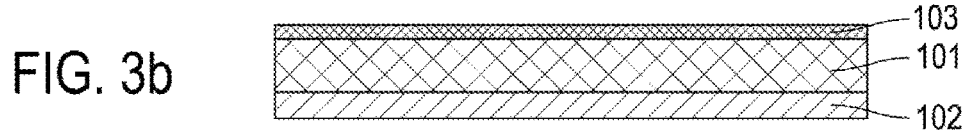
FIG. 3b
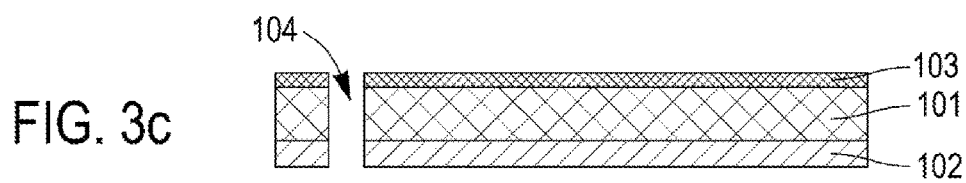
FIG. 3c
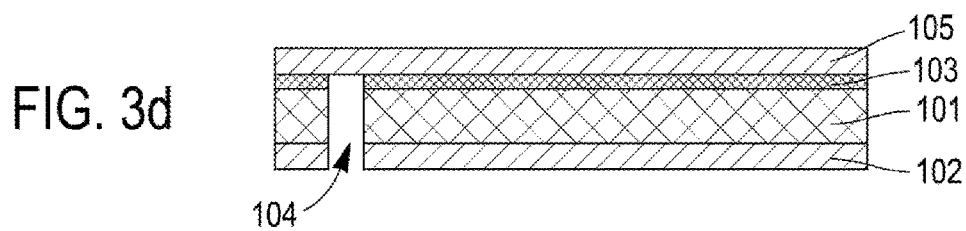
FIG. 3d
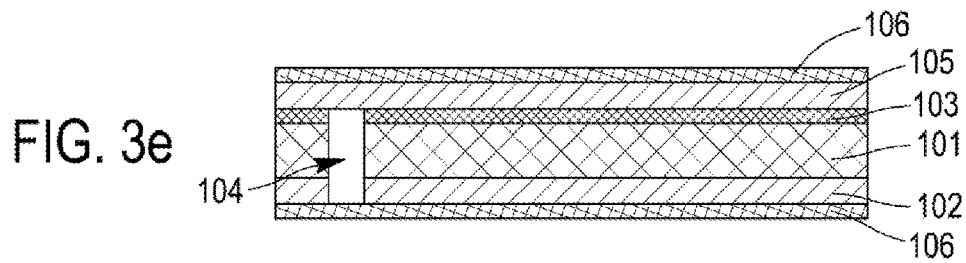
FIG. 3e
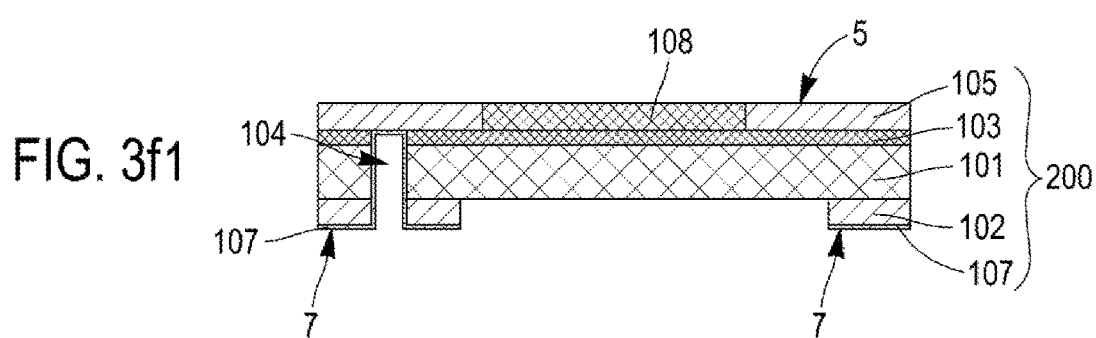
FIG. 3f1
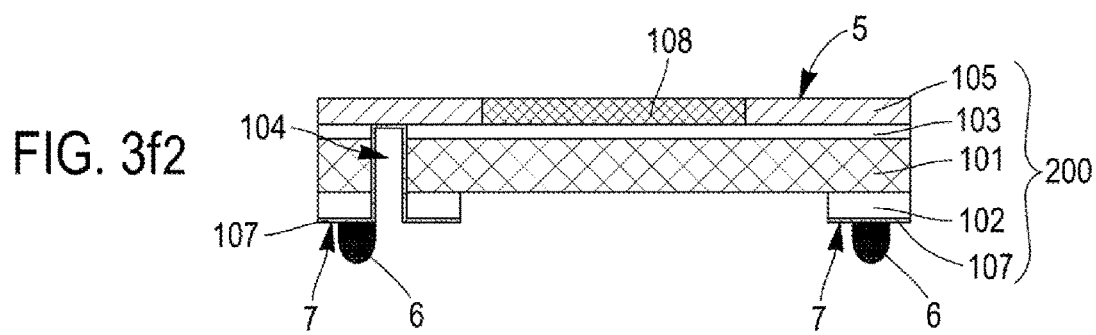
FIG. 3f2

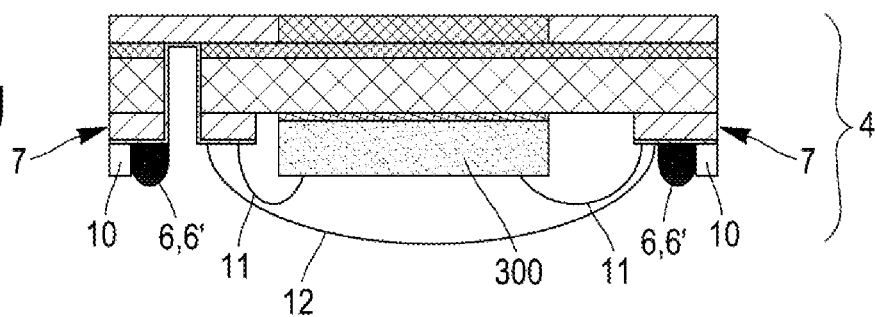
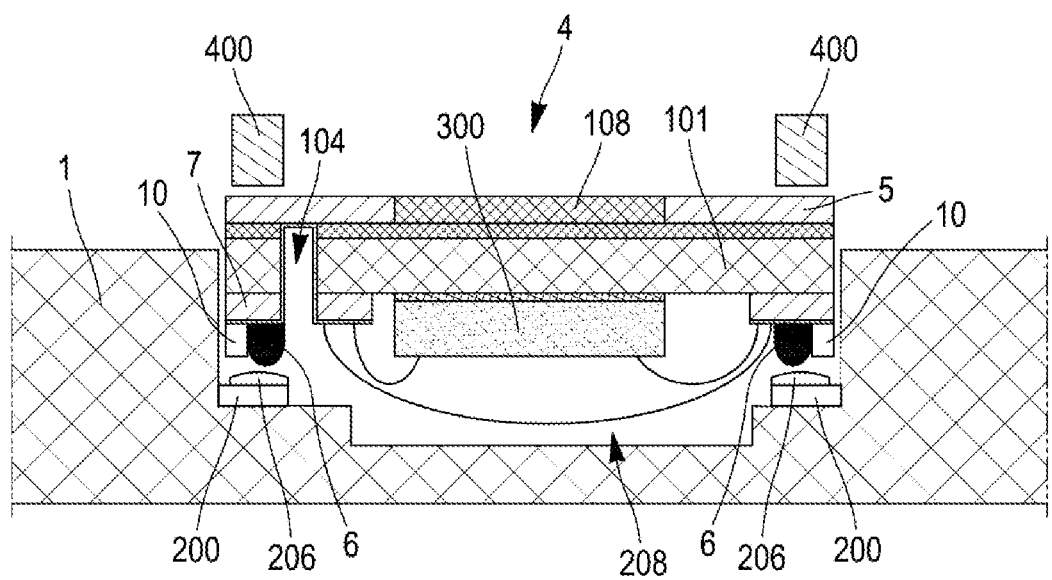
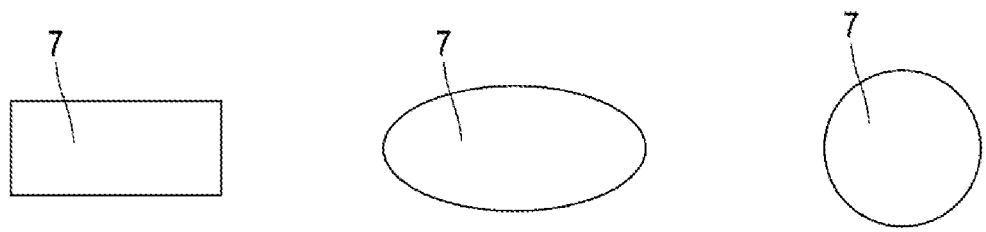
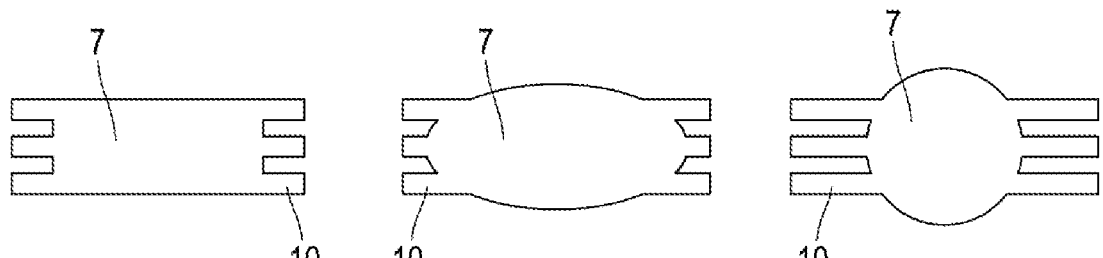

BIOMETRIC SENSOR MODULE FOR A SMART CARD AND METHOD FOR MANUFACTURING SUCH A MODULE

CROSS REFERENCE TO RELATED APPLICATION

This patent application is a U.S. National Stage application of International Patent Application Number PCT/FR2020/000129 filed Apr. 16, 2020, which is hereby incorporated by reference in its entirety, and claims priority to FR 1904204 filed Apr. 19, 2019.

TECHNICAL FIELD

The invention relates to the field of chip cards.

PRIOR ART

In the field of chip cards, and notably in that of chip cards used as payment means, manufacturers are always wishing to offer users greater security. It has thus been proposed to integrate biometric sensors for reading fingerprints into chip cards. Reference may be made to patent applications DE10139414A1 and US20170277936A1 for examples of such cards.

For example, for cards benefiting from contact-based and contactless read modes, a module integrated into the card and comprising a biometric sensor may allow a transaction to be authorized only if the fingerprint of the card holder is detected. This type of card is described for example in the patent document published under the number EP 3 336 759 A1. To produce such a card, a cavity is milled into the card so as to expose an electrical circuit integrated beforehand into the body of the card and house the module there. The module then housed in this cavity is also electrically connected to the circuit.

Integrating a module comprising a biometric sensor into the card is a difficult operation. Specifically, the connection between the module and the electrical circuit of the card has to be reliable, stable over time, cause no damage to the sensor, and should not negatively affect the aesthetics of the card, etc.

An object of the invention is to at least partially contribute to facilitating the integration of the module into the card.

SUMMARY OF THE INVENTION

What is thus proposed according to the invention is a biometric sensor module for a chip card, comprising
- a dielectric carrier comprising a front face and a back face, both forming main faces of the carrier,
- a biometric sensor for detecting fingerprints attached to the back face and extending beneath the rear face over a detection area,
- electrically conductive connection pads, arranged on the back face of the carrier and electrically connected to the biometric sensor.

In this module, at least one connection pad comprises a region that is wettable with a solder material, this region extending over an area of between 0.2 and 5 square millimetres and advantageously equal to or greater than 0.79 square millimetres.

Thus, by virtue of these dimensions of the area of the region that is wettable with a solder material, it is made possible to control the shape of the blob (or bead) of solder material which will be deposited on the connection pads. In this document, the term "blob" is used to refer to the solder material both before it is deposited on a connection pad and after it has been deposited on a connection pad (the term "drop" is commonly used before deposition on a connection pad and "solder bump" is commonly used when the solder material has been deposited on a connection pad. In general, in this text, the term "blob" refers to the shape of the solder material deposited on a connection pad but, where applicable, a person skilled in the art will understand, according to the context in which the term "blob" is used, whether this term might refer to the solder material which has not yet been deposited on a solder pad. This blob of solder material may be obtained, for example, by depositing the material on the wettable region and by using a reflow technique or by depositing the blob in liquid form and then cooling it. The controlled shape of the blob of solder material may make it possible to have a height of solder material that is sufficient to connect the connection pads to the circuit of the card while avoiding the solder material creeping in an uncontrolled manner, for example during an at least partial reflow of the solder material when embedding the module, and rising up between the module and the walls of the cavity in particular, onto the surface of the card.

This chip card module optionally comprises one and/or another of the following features, each considered independently of one another, or each in combination with one or more others:
- at least one connection pad has a region that is wettable with a solder material delimited by an essentially continuous perimeter taking a shape chosen from among a rectangle, a rhombus, a square, an oval, or a circle;
- at least one connection pad comprises extensions extending from the region that is wettable with a solder material towards a free end;
- a blob of solder material is deposited on the wettable region of at least one connection pad, this blob having a volume of between 0.002 and 0.070 cubic millimetres;
- the solder material is an alloy having a melting temperature lower than or equal to 140° C., for example included in the list consisting of tin/bismuth, tin/bismuth/silver and tin/indium;
- the blob of solder material has a height measured perpendicular to the carrier between the surface of the connection pad on which it is deposited and its highest point of between 0.020 and 0.200 millimetres, and more preferably of between 0.040 and 0.150 millimetres;
- at least one connection pad is placed essentially opposite a region of the front face covered with a bezel and at least one conductive via is made in the thickness of the carrier, this via electrically connecting the bezel to the connection pad; and
- the dielectric carrier is a flexible carrier from a family included in the list consisting of polyimides, polyethylene terephthalates (PET and PET copolymers), polyethylene naphthalates and epoxy glasses.

According to another aspect, the invention relates to a chip card comprising a biometric sensor module according to the invention. This chip card comprises a card body with an electrical circuit integrated into the card body. The module and the circuit are electrically connected to one another using a solder material.

This chip card optionally comprises one and/or another of the following features, each considered independently of one another, or each in combination with one or more others:

the module and the circuit are electrically connected using a solder material deposited on at least one connection pad the melting temperature of which is lower than or equal to 140° C.;

the module and the circuit are electrically connected using a solder material deposited on at least one connection pad and a solder material deposited on the circuit, the melting temperature of the solder material deposited on at least one connection pad being lower than or equal to that of the solder material deposited on the circuit.

According to yet another aspect, the invention relates to a method for producing a biometric sensor module for a chip card, comprising steps of providing a dielectric carrier comprising a front face and a back face, both forming main faces of the carrier, attaching a biometric sensor for detecting fingerprints to the back face, a detection area covered by the sensor on the back face being placed opposite a detection area on the front face, producing electrically conductive connection pads on the back face of the carrier which are electrically connected to the biometric sensor.

According to this method, at least one connection pad comprises a region that is wettable with a solder material, extending over an area equal to or greater than 0.79 square millimetres.

This method optionally comprises one and/or another of the following features, considered independently of one another or each in combination with one or more others:

a blob of solder is deposited on a connection pad;

the solder material is deposited on a connection pad using a technique included in the list consisting of jetting, placement of a ball of solder material (solder ball), dispensing solder material in liquid or paste form, printing the solder material in liquid or paste form (screen printing), using the tip of a pin (pin transfer) to transfer the solder material in liquid or paste form, placement using preformed solder material (solder preform), followed by or not followed by a reflow step;

the solder material is deposited on a connection pad after the biometric sensor has been attached to the back face of the carrier; and the biometric sensor is attached to the back face of the carrier using an adhesive for attaching chips which crosslinks at temperatures of between 100° C. and 150° C.

BRIEF DESCRIPTION OF THE DRAWINGS

Further aspects, aims and advantages of the invention will become apparent from reading the following detailed description, and with reference to the appended drawings, which are given by way of non-limiting examples and in which:

FIG. 3 schematically shows a sectional view of various steps of one example of a method for producing a biometric sensor module, such as the one integrated into the card shown in FIG. 2;

FIG. 4 schematically shows a sectional view of the integration of a biometric sensor module, obtained using a method such as the one illustrated by FIG. 3, into a card;

FIG. 5 schematically shows various variants that are conceivable for the shape of the connection pads placed on the back face of a biometric sensor module obtained using a method such as the one illustrated in FIG. 3; and FIG. 6 schematically shows yet other variants that are conceivable for the shape of the connection pads placed on the back face of a biometric sensor module obtained using a method such as the one illustrated in FIG. 3.

DETAILED DESCRIPTION

Figure 1:
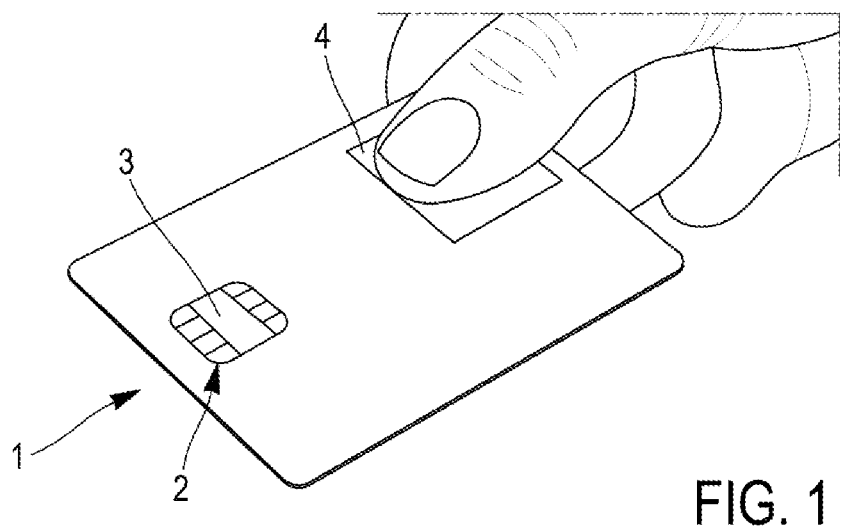
FIG. 1 schematically shows a perspective view of a chip card according to a first example of an embodiment of the invention.

One example of a chip card 1 according to the invention is shown in FIG. 1. In this example, the card 1 is a bank card in the ID-1 format. It will be noted that this is just one example and that the invention may be applied to other types of cards (controlled access cards, identity cards, transport cards, logical access control cards, etc.). This card 1 has a first module 2 comprising a connector 3 and an electronic chip (underneath the connector). The connector 3 makes it possible to electrically connect the electronic chip to a card reader in order to exchange data between the chip and the card reader.

In the case of dual-interface cards, that is to say allowing contact-based or contactless reading, this card 1 also has an antenna integrated into the body of the card 1. This antenna is connected for example to the chip situated in the first module 2. This antenna allows the contactless exchange of data between the chip and a contactless card reader. This antenna, or another part of an electrical circuit situated in the body of the card 1, is also electrically connected to a second module 4 integrated into the card 1. The second module 4 is a biometric module. This biometric module 4 comprises a sensor for fingerprint recognition. The second module 4 makes it possible to determine whether the fingerprint read by the sensor corresponds to that of a user authorized to use this card 1. In this case, contactless communication between the chip and a reader may be authorized.

Figure 2:
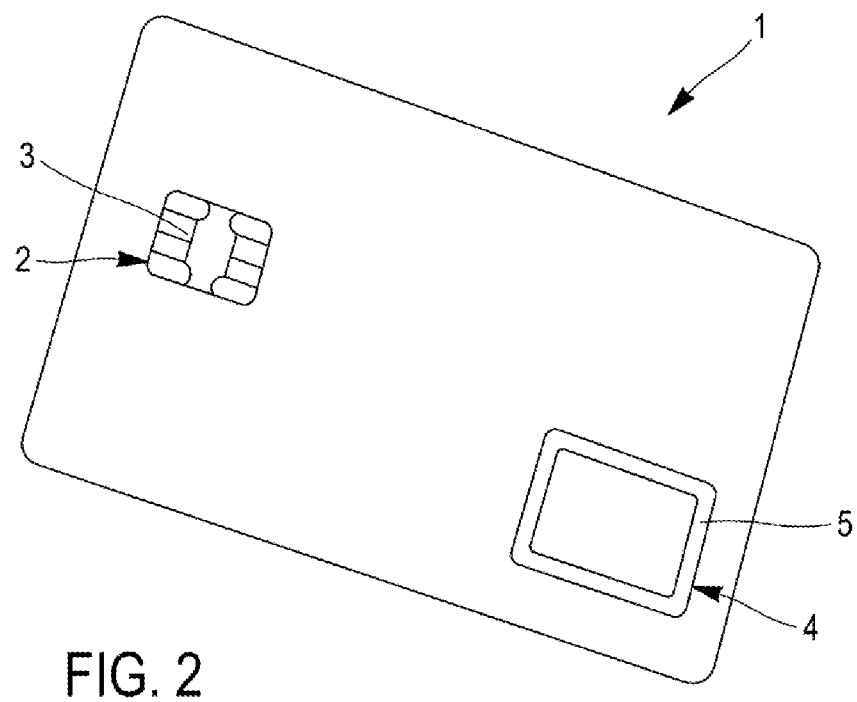
FIG. 2 schematically shows a perspective view of a chip card according to a second example of an embodiment of the invention.

The exemplary embodiment of the card 1 shown in FIG. 2 differs from that shown in FIG. 1 essentially in that the second module 4 comprises a conductive border 5 (bezel 5) which may be continuous or not continuous. The bezel 5 is electrically connected to the biometric sensor located on the back face of the second module 4. It allows the removal of potential electrostatic charge which might damage the sensor or prevent the sensor from reading a fingerprint. In FIG. 2, the bezel 5 is in the shape of a continuous ring. According to some variants, the bezel 5 may consist of a plurality of conductive segments, or points, arranged around the region on which a finger is to be placed in order to read the corresponding fingerprint.

The method for producing a module of the type illustrated in FIG. 2 is described below.

This process comprises:

Providing a complex material 100 comprising a carrier 101 made of dielectric material, on which a sheet consisting of an electrically conductive material 102 is laminated (see FIG. 3a); for example, the dielectric material is a polyimide the thickness of which is between 25 and 75 micrometres, and is preferably equal to 50 micrometres, and the first electrically conductive material 102 is a copper alloy the thickness of which is between 12 and 35 micrometres, and is preferably equal to 18 micrometres; for effective implementation of the method according to the invention on an industrial scale, this complex material 100 (copper clad) is advantageously provided in a reel and the method is implemented reel-to-reel;

Coating, with an adhesive material 103, the face of the dielectric material opposite that on which the first electrically conductive material is laminated (see FIG. 3b); the adhesive material 103 is, for example, an epoxy resin, potentially modified with mineral fillers and resins; the adhesive material 103 is thus deposited with a thickness of between 10 and 25 micrometres; the adhesive material 103 potentially undergoes a process of continuous drying in order to remove the solvents present in the formulation when it is deposited;

Perforating holes 104 through the new complex material comprising the dielectric carrier 101, the layer of the first electrically conductive material 102 and the layer of adhesive material 103 (see FIG. 3c);

Laminating a layer of a second electrically conductive material 105; for example, this second electrically conductive material is a copper alloy, the thickness of which is between 12 and 35 micrometres, and preferably this thickness is equal to 18 micrometres; this layer consisting of the second electrically conductive material 105 closes off the holes 104 (see FIG. 3d); the adhesive material 103 potentially undergoes a step of crosslinking following a defined cycle with temperature plateaus suitable for the chemistry of the adhesive material 103;

Laminating a dry photoresist film 106 on each of the two main faces of the complex obtained on completion of the preceding step (see FIG. 3e), followed by light exposure through a mask and lifting of the photoresist to form patterns used in subsequent steps;

etching certain regions of the layers of first 102 and second 105 electrically conductive materials;

electrolytically depositing layers of metals 107 (copper, nickel, gold, palladium, or silver, for example) which are intended to facilitate the soldering of connection wires to the second conductive material and/or to produce conductive vias between the first 102 and the second 105 conductive material at the holes 104;

depositing a layer of a protective material 108 on a detection region; this protective material 108 is, for example, a photoimageable coverlay material, i.e. a photosensitive material; for example, the layer of protective material 108 has a thickness of between 15 and 50 micrometres, and is, for example, equal to 25 micrometres; for example, the layer of protective material 108 is deposited as a film laminated on the front face of the carrier 101; for example the layer of protective material 108 is deposited in the form of an epoxy-acrylate film (for example, it is the product sold under the reference by Ethernal (www.eternal-group-.com); alternatively, the layer of protective material 108 is deposited by using a screen printing technique; as another alternative, the layer of protective material 108 is deposited using a technique akin to that of ink-jetting; as another alternative, the layer of protective material 108 is deposited using a coating technique; the protective layer 108 extends on the front face over an area corresponding to a detection region; and in the case that the layer of a protective material 108 is deposited using a non-selective deposition technique, after deposition of the layer of the protective material 108, it may be necessary to carry out a step of exposure to suitable radiation through a mask, followed by a chemical development step;

a step of thermally crosslinking the protective layer.

By virtue of the layer of protective material 108 consisting of the photoimageable coverlay material, it is possible to protect the carrier 101 with a relatively mechanically and chemically resistant material, the use of which may be easily integrated into an industrial process, in particular into a reel-to-reel process, compatible with heating steps required for potential solder connection of the module 4 to the circuit 200 that is already integrated within the body of a card. Its photoimageable character is additionally compatible with the implementation of photolithography steps which are industrially controllable and compatible with high yields.

Preferably, the protective layer 108 comprising the photoimageable coverlay material is based on epoxy-acrylate resins, the physicochemical properties of which, in particular in terms of hardness and abrasion resistance, are, after UV or thermal crosslinking, better than those which could be obtained with pure acrylates, for example. Likewise, epoxy-acrylate resins are easier to implement than epoxy resins.

According to one particular mode of implementation of the method according to the invention, a solder material 6 is deposited on connection pads 7 produced in the layer of the first conductive material 102 in the preceding steps. For example, the solder material 6 is a tin-bismuth, tin-bismuth-silver or tin-indium alloy. For example, the solder material 6 is deposited using screenprinting or jetting (or using other methods as mentioned above). Additionally, instead of making the holes 104 conductive using electrolytic depositions of layers of metals 107, it is also possible to take advantage of this step of depositing a solder material 6 to deposit this material in the holes 104 and thereby make them conductive between the layers of the first 102 and of the second 105 conductive materials.

The solder material 6 may be deposited on connection pads 7 of various shapes (see FIG. 5). For example, these shapes have an essentially continuous perimeter which delimits a region that is wettable with a solder material, this region that is wettable with a solder material taking a rectangular, rhomboid (potentially square), oval, or round shape.

As an alternative, instead of depositing a solder material 6 on the connection pads 7, these are left untouched until the operation of embedding the module 4 in the card 1. Then, during the embedding operation, prior to installing the module 4 in the cavity 208 formed (for example by milling) in the card body, a solder material 6, a paste or an anisotropic conductive film 6' is deposited on the connection pads 7 in order to establish a connection with the circuit 200 housed in the card body (see FIGS. 3g and 4). When a paste or an anisotropic conductive film 6' is used, the connection pads 7 may take a shape such as those described above with reference to FIG. 5 or else they may take a shape with extensions 10 allowing better adhesion of the paste or better performance in terms of electrical conductivity of the anisotropic conductive film 6' on the connection pads 7.

However, more advantageously, the connection pads 7 have a shape that is compatible both with the use of a solder material 6 and with a paste or an anisotropic conductive film 6'. To that end, the connection pads 7 may take shapes comprising a region that is wettable with a solder material, this region being delimited by an essentially continuous perimeter taking a shape chosen from among a rectangle, a rhombus, a square, an oval, or a circle, and lateral extensions 10 extending from the region that that is wettable with a solder material towards a free end (see FIG. 6).

At the end of the above steps, a reel bearing biometric sensor carriers 200 for a chip card is obtained. Each of these carriers 200 has a structure corresponding, for example, to that shown in FIG. 3f1 or in FIG. 3f2 depending on whether the biometric sensor is assembled before or after the deposition of the solder paste 6 on the lands 7. Each carrier 200 therefore comprises:

- A front face, with a bezel 5 formed in the layer of the second conductive material 105, and a protective layer 108 deposited on the layer of adhesive material 103, at a detection region located inside the ring formed by the bezel 5;
- A back face with connection pads 7, possibly with a blob of a solder material 6 deposited on at least some of these connection pads 7 in order to be able to subsequently connect a module 4 to a circuit 200 integrated into the card body.

For the purpose of being used and integrated into a chip card, each carrier 200 is equipped with a biometric fingerprint sensor 300. This biometric sensor 300 is fastened to the back face for example using a known die attach technology. For example, the biometric sensor 300 is fastened to the back face of the carrier 101 using a thermosetting adhesive that sets at temperatures between 100° C. and 150° C. and that has the property of migrating, through capillary action, under the entire surface of the sensor without generating any gaps or bubbles ("underfill").

A solder material 6 is deposited on connection pads 7 before or after the biometric sensor 300 is assembled, but preferably after in order to avoid the biometric sensor 300 experiencing a thermal shock during the operation of reflow of the solder paste forming the solder material 6.

Likewise, the solder material 6 is deposited using screen-printing or jetting (or using other methods as mentioned above).

The solder material 6 is preferably deposited on connection pads 7 by jetting if the biometric sensor 300 is already assembled on the dielectric carrier 101.

The biometric sensor 300, on the back face, occupies an area corresponding essentially to a detection area located opposite the detection region on which the protective layer 108 is deposited. This biometric sensor 300 is connected to the connection pads 7 and to the bezel 5 using a known technique, such as the flip-chip technique or the wire-bonding technique using wires 11. Advantageously, the biometric sensor 300 and its possible conductive wires 11 are protected in an encapsulating resin 12. A hotmelt adhesive 10 is possibly also arranged on the back face on or next to the connection pads 7. This hotmelt adhesive 10 is intended to fasten the biometric sensor module 4 in the cavity 208 formed in the body of a chip card.

When the module 4 is embedded in a card body, there are several possible options for establishing a connection between the connection pads 7 of the module and the circuit 200 that is integrated into the card body. It is possible, for example, to solder the connection pads 7 directly to the circuit 200 using the solder material 6 deposited on the connection pads 7 (see FIG. 4). As an alternative, it is possible to deposit blobs 206 of a solder material on the circuit 200 and form a connection between the solder pads 7 and the circuit 200 by melting one, the other or both solder materials that have been deposited beforehand, each respectively, on the connection pads 7 and on the circuit 200. More particularly, for example, it is possible to deposit a first solder material 6 on the connection pads 7 and a second solder material 206 on the circuit 200. The second solder material is preferably deposited on the circuit 200 before finalizing the card body (i.e. before stacking and laminating the various constituent layers of the chip card 1). The first solder material 6 is then advantageously a solder material having a low melting temperature (for example a melting temperature lower than or equal to 140° C.), the second solder material 206 having a higher melting temperature close or identical to that of the first solder material 6. Advantageously, the use of a second solder material 206 with a higher melting temperature makes it possible to limit the risk of creep of the one or more solder materials into and towards the edge of the cavity 208, or even out of same.

For example, to make the connection between the connection pads 7 and the circuit 200, a thermode 400 is placed on the bezel 5. Since the bezel 5 is advantageously opposite the connection pads 7 on either side of the carrier 101, there is thus particularly good thermal conduction between the two faces of the carrier 101.

Using a first solder material 6 with a low melting temperature (lower than or equal to 140° C.) on the connection pads 7 and a second solder material 206 with a higher melting temperature on the circuit 200, the thermode 400, heated for example to a temperature of 230° C., is applied for 2.5 seconds. The heat provided by the thermode 400 also dissipates into the hotmelt adhesive 10 so as to adhesively bond the module 4 in the card 1.

Using a first solder material 6 with a low melting temperature (lower than or equal to 140° C.) on the connection pads 7 and a second solder material 206 on the circuit 200 having a melting temperature equal to, close to or lower than that of the first solder material 6, the thermode 400, heated for example to a temperature of 230° C., is applied for 1.5 seconds. The method according to the invention is therefore faster in this case. Furthermore, using solder materials 6, 206 with a low melting temperature makes it possible to use a thermode 400 with a smaller carrier surface, thereby possibly helping to better control creep and to limit risks of deformation of the card 1 and/or of the module 4.

Generally speaking, it is possible to use an electrically conductive adhesive or paste 6', an anisotropic conductive film or a solder material 6 to connect the module 4 to the circuit 200. However, in any case, the method described above or variants thereof are advantageously used by producing connection pads 7 having a shape that is compatible both with the use of a solder material 6 and with a paste or an anisotropic conductive film 6', this shape possibly being rectangular, corresponding to a rhombus, a square, an oval or a disc shape, and also with radial or lateral extensions 10 (see FIG. 6). The module 4 according to the invention is then the same whether it is connected through soldering or using a conductive adhesive. This makes it possible to produce the module 4 in larger runs, while still leaving the embedder the option of choosing one or the other of the connection technologies.

The production and embedding of a module 4 comprising a bezel 5 on the front face has been described with reference to FIGS. 2, 3 and 4. In the case, for example, that the biometric sensor 300 is not, or not very, sensitive to electrostatic charge, the bezel 5 may be omitted (see FIG. 1). The method described above is then easily simplified. The production of the holes 104 may be omitted. It is also possible to use just one sheet of conductive material 102 (the steps illustrated by FIGS. 3c and 3d are thus omitted in particular). The conductive material 102 is then placed only on the back face of the carrier 101, to form the connection pads 7. The protective layer 108 is produced so as to cover at least the detection region located opposite the detection area of the sensor 300. The protective layer 108, besides its function of actually protecting the carrier 101, indicates where to place a finger to detect the fingerprint. The protective layer 108 may be coloured in different colours in order, for example, to harmonize it with the colour of the card 1.

The protective layer 108 potentially consists of an ink or comprises an ink. For example, it is an epoxy-acrylate-based ink. For example, it is the product sold under the reference SD 2444 NB-M by Peters (www.peters.de).

The invention claimed is:

1. Biometric sensor module for a chip card, comprising:
    a dielectric carrier comprising a front face and a back face, both forming main faces of the carrier,
    a biometric sensor for detecting fingerprints attached to the back face and extending beneath the back face over a detection area located facing a detection region located on the front face of the carrier,
    electrically conductive connection pads, arranged on the back face of the carrier and electrically connected to the biometric sensor,
    wherein at least one connection pad comprises a region that is wettable with a solder material, extending over an area of between 0.2 and 5 square millimetres, and
    wherein at least one connection pad is placed essentially opposite a region of the front face covered with a bezel and at least one conductive via is made in the thickness of the carrier, the via electrically connecting the bezel to the at least one connection pad.

2. The biometric sensor module according to claim 1, in which at least one connection pad has a region that is wettable with a solder material delimited by an essentially continuous perimeter taking a shape chosen from among a rectangle, a rhombus, a square, an oval, or a circle.

3. The biometric sensor module according to claim 2, in which at least one connection pad comprises extensions extending from the region that is wettable with a solder material towards a free end.

4. The biometric sensor module according to claim 1, in which a blob of solder material is deposited on the wettable region of at least one connection pad, this blob having a volume of between 0.002 and 0.070 cubic millimetres.

5. The biometric sensor module according to claim 4, in which the solder material is an alloy having a melting temperature lower than or equal to 140° C. and included in the list consisting of tin/bismuth and tin/bismuth/silver and tin/indium.

6. The biometric sensor module according to claim 4, in which the blob of solder material has a height measured perpendicular to the carrier, between the surface of the connection pad on which it is deposited and its highest point, of between 0.040 and 0.150 millimetres.

7. The biometric sensor module according to claim 1, in which the dielectric carrier is a flexible carrier from the polyimide family.

8. A chip card comprising:
    a card body with an electrical circuit integrated into the card body; and
    the biometric sensor module according to claim 1,
    wherein the module and the circuit are electrically connected with a solder material.

9. The chip card according to claim 8, in which the biometric sensor module and the circuit are electrically connected using a solder material deposited on at least one connection pad the melting temperature of which is lower than or equal to 140° C.

10. The chip card according to claim 8, in which the biometric sensor module and the circuit are electrically connected using a solder material deposited on at least one connection pad and a solder material deposited on the circuit, the melting temperature of the solder material deposited on at least one connection pad being lower than or equal to that of the solder material deposited on the circuit.

11. Method for producing a biometric sensor module for a chip card, comprising steps of
    providing a dielectric carrier comprising a front face and a back face, both forming main faces of the carrier,
    attaching a biometric sensor for detecting fingerprints to the back face, a detection area covered by the sensor on the back face being placed opposite a detection area located on the front face of the carrier,
    producing electrically conductive connection pads on the back face of the carrier which are electrically connected to the biometric sensor,
    wherein at least one of the connection pads comprises a region that is wettable with a solder material, extending over an area of between 0.2 and 5 square millimetres, and
    wherein at least one connection pad is placed essentially opposite a region of the front face covered with a bezel and at least one conductive via is made in the thickness of the carrier, the via electrically connecting the bezel to the at least one connection pad.

12. The method according to claim 11, in which a blob of solder is deposited on a connection pad.

13. The method according to claim 12, in which the solder material is deposited by jetting on a connection pad.

14. The method according to claim 12, in which the solder material is deposited on a connection pad after the biometric sensor has been attached to the back face of the carrier.

15. The method according to claim 11, in which the biometric sensor is attached to the back face of the carrier using an adhesive for attaching chips which crosslinks at temperatures of between 100° C. and 150° C.

\* \* \* \* \*